(12) United States Patent
Brunner et al.

(10) Patent No.: US 7,129,694 B2
(45) Date of Patent: Oct. 31, 2006

(54) LARGE SUBSTRATE TEST SYSTEM

(75) Inventors: Matthias Brunner, Kirchheim (DE); Shinichi Kurita, San Jose, CA (US); Wendell T. Blonigan, Union City, CA (US); Edgar Kehrberg, Haar (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/155,796

(22) Filed: May 23, 2002

(65) Prior Publication Data

US 2003/0218456 A1  Nov. 27, 2003

(51) Int. Cl.
 *G01R 31/28* (2006.01)
(52) U.S. Cl. .................................... 324/158.1
(58) Field of Classification Search ............... 324/754, 324/158.1, 765, 73.1; 156/345; 15/301; 451/28, 67; 134/32
See application file for complete search history.

(56) References Cited

U.S. PATENT DOCUMENTS

| | | | |
|---|---|---|---|
| 656,622 A * | 8/1900 | Amano et al. ................. 7/117 |
| 3,983,401 A | 9/1976 | Livesay | |
| 4,090,056 A | 5/1978 | Lockwood et al. | |
| 4,495,966 A | 1/1985 | Longamore | |
| 4,528,452 A | 7/1985 | Livesay | |
| 4,725,736 A | 2/1988 | Crewe | |
| 4,740,705 A | 4/1988 | Crewe | |
| 4,760,567 A | 7/1988 | Crewe | |
| 4,764,818 A | 8/1988 | Crew | |
| 4,843,312 A | 6/1989 | Hartman et al. ......... 324/158 R |
| 4,983,833 A | 1/1991 | Brunner et al. | |
| 4,985,681 A | 1/1991 | Brunner et al. ............. 324/501 |
| 5,175,495 A | 12/1992 | Brahme et al. | |
| 5,258,706 A | 11/1993 | Brunner et al. ......... 324/158 R |
| 5,268,638 A | 12/1993 | Brunner et al. | |
| 5,278,494 A | 1/1994 | Obigane .................. 324/158 F |
| 5,313,156 A * | 5/1994 | Klug et al. ............... 324/158.1 |
| 5,368,676 A * | 11/1994 | Nagaseki et al. ........... 156/345 |
| 5,369,359 A | 11/1994 | Schmitt .................... 324/158.1 |
| 5,371,459 A | 12/1994 | Brunner et al. ............. 324/770 |
| 5,414,374 A | 5/1995 | Brunner et al. ............. 324/770 |
| 5,558,717 A | 9/1996 | Zhao et al. | |

(Continued)

FOREIGN PATENT DOCUMENTS

EP 0 537 505 4/1993

(Continued)

OTHER PUBLICATIONS

Copy of Invitation to Pay Additional Fees dated Oct. 21, 2003 for corresponding PCT application, PCT/US03/15903.

(Continued)

*Primary Examiner*—Jermele Hollington
*Assistant Examiner*—Trung Q Nguen
(74) *Attorney, Agent, or Firm*—Patterson & Sheridan LLP (57) ABSTRACT

A system and method for testing substrates is generally provided. In one embodiment, a test system for testing a substrate includes a load lock chamber, a transfer chamber and a test station. The load lock chamber and the test station are disposed on top of one another and coupled to the transfer chamber. The transfer chamber includes a robot adapted to transfer a substrate between the load lock chamber, which is at a first elevation, and the test station, which is at a second elevation. In another embodiment, a test station is provided having a turntable adapted to rotate the substrate. The turntable enables the range of motion required to test the substrate to be substantially reduced while facilitating full test and/or inspection of the substrate.

31 Claims, 11 Drawing Sheets

U.S. PATENT DOCUMENTS

| | | |
|---|---|---|
| 5,801,764 A | 9/1998 | Koizumi et al. |
| 5,834,007 A | 11/1998 | Kubota |
| 5,834,773 A | 11/1998 | Brunner et al. |
| 5,982,190 A | 11/1999 | Toro-Lira .................. 324/770 |
| 6,086,362 A | 7/2000 | White et al. |
| 6,137,303 A | 10/2000 | Deckert et al. |
| 6,559,454 B1 | 5/2003 | Murrell et al. |
| 6,566,897 B1 | 5/2003 | Lo et al. |
| 2001/0000662 A1 | 5/2001 | Hashimoto et al. ........... 345/96 |
| 2002/0024023 A1 | 2/2002 | Brunner et al. |
| 2002/0034888 A1 | 3/2002 | Kurita et al. |
| 2002/0043652 A1 | 4/2002 | Yamazaki et al. ............ 257/72 |

FOREIGN PATENT DOCUMENTS

| | | |
|---|---|---|
| EP | 0370 276 | 1/1994 |
| EP | 0 542 094 | 1/1997 |
| EP | 0 932 182 | 7/1999 |
| WO | 99/60614 | 11/1999 |
| WO | 02/33745 | 4/2002 |

OTHER PUBLICATIONS

PCT International Search Report for PCT/US03/15903, dated Jan. 16, 2004 (AMAT/7356PCT)..

Brunner. et al., "Development of Puma 5500/10K Platform," AKTNews, vol. 5, Jan. 2001, p. 13-14.

Brunner, M., "TFT Array Testing: Replacing Mechanics by Electron Beam Deflection," AKTNews, vol. 6, Apr. 2001, p. 15-17.

* cited by examiner

LARGE SUBSTRATE TEST SYSTEM

BACKGROUND OF THE INVENTION

1. Field of the Invention

Embodiments of the invention generally relate to processing systems for large substrates.

2. Background of the Related Art

Thin film transistors (TFT) are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass processing equipment is generally configured to accommodate substrates up to about one square meter. Processing equipment configured to accommodate substrate sizes up to and exceeding 1½ square meters is envisioned in the immediate future. Such large substrates represent a substantial investment to flat panel display fabricators. In order to monitor and correct defects during processing, flat panel display fabricators are increasingly turning toward device testing during the fabrication stage. One such device which enables flat panel display fabricators to test devices formed on flat panels is a PUMA™ electron beam tester available from AKT, Inc., a division of Applied Materials, Inc., located in Santa Clara, Calif.

An electron beam tester provides process testing of the thin film transistor matrix. The electron beam test offers several test methods. It can be used for sensing pixel voltages in response to the voltage applied across the pixels or the pixel may be driven by the beam by providing a current to charge up the pixel. The pixel response to the current may be monitored to provide defect information.

During testing, each pixel must be positioned under the electron beam. This is accomplished by positioning the flat panel on an X/Y table positioned below the beam. As the X/Y table moves laterally to sequentially position each pixel below the electron beam, an area must be dedicated around the X/Y table to provide space for this movement.

However, as testing equipment is increased in size to accommodate larger flat panels, simple scaling of current equipment designs would result in disadvantageously large equipment footprints. Correspondingly, larger equipment footprint per processing unit throughput results in a high cost of ownership to the equipment owner. Moreover, the large size of the equipment also increases the cost of shipping and may, in some cases, restrict the means and locales to which such equipment may be transported.

Therefore, there is a need for a compact testing system for flat panel displays.

SUMMARY OF THE INVENTION

In one aspect of the invention, systems for testing a substrate are generally provided. In one embodiment, a system for testing a substrate includes a transfer chamber having a load lock chamber and a test station coupled thereto. The test station is stacked at least partially above the load lock chamber. A robot is disposed in the transfer chamber and is adapted to transfer substrates between the load lock chamber and the test station.

In another embodiment, a system for testing a substrate includes test station having a positioning table and a plurality of test mechanisms disposed therein. The positioning table is adapted to move the substrate within a pre-defined planar range of motion. The plurality of test mechanisms are adapted to selectively interact with discrete areas of the substrate positioned substantially thereunder by the positioning table.

In another embodiment, a system for testing a substrate includes test station having a positioning table and at least one test mechanism disposed therein. The positioning table is adapted to move the substrate in both a rotational and X/Y planar motion. The at least one test mechanism is adapted to selectively interact with discrete areas of the substrate positioned substantially thereunder by the positioning table.

In another aspect, a method for testing a substrate is provided. In one embodiment, a method for testing a substrate includes transferring a substrate from a load lock chamber to a transfer chamber, changing the elevation of the substrate within the transfer chamber, transferring the substrate from the transfer chamber to a test station, and testing the substrate.

In another embodiment, a method for testing a substrate includes moving a first portion of a substrate in a test station below an electron beam generator, rotating the substrate, moving a second portion of the substrate below the electron beam generator, and sequentially testing the portions of the substrate that pass below the electron beam generator.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Embodiments of the present invention generally provide a method and system for testing and/or inspecting large substrates, such as those used to make flat panel thin film transistor displays. Although the test systems described herein provide a compact footprint as compared to known conventional systems for large area substrates, aspects of the space-saving and other features of the test systems may be readily incorporated into other test systems configured to process substrates of other types and sizes.

Figure 1:
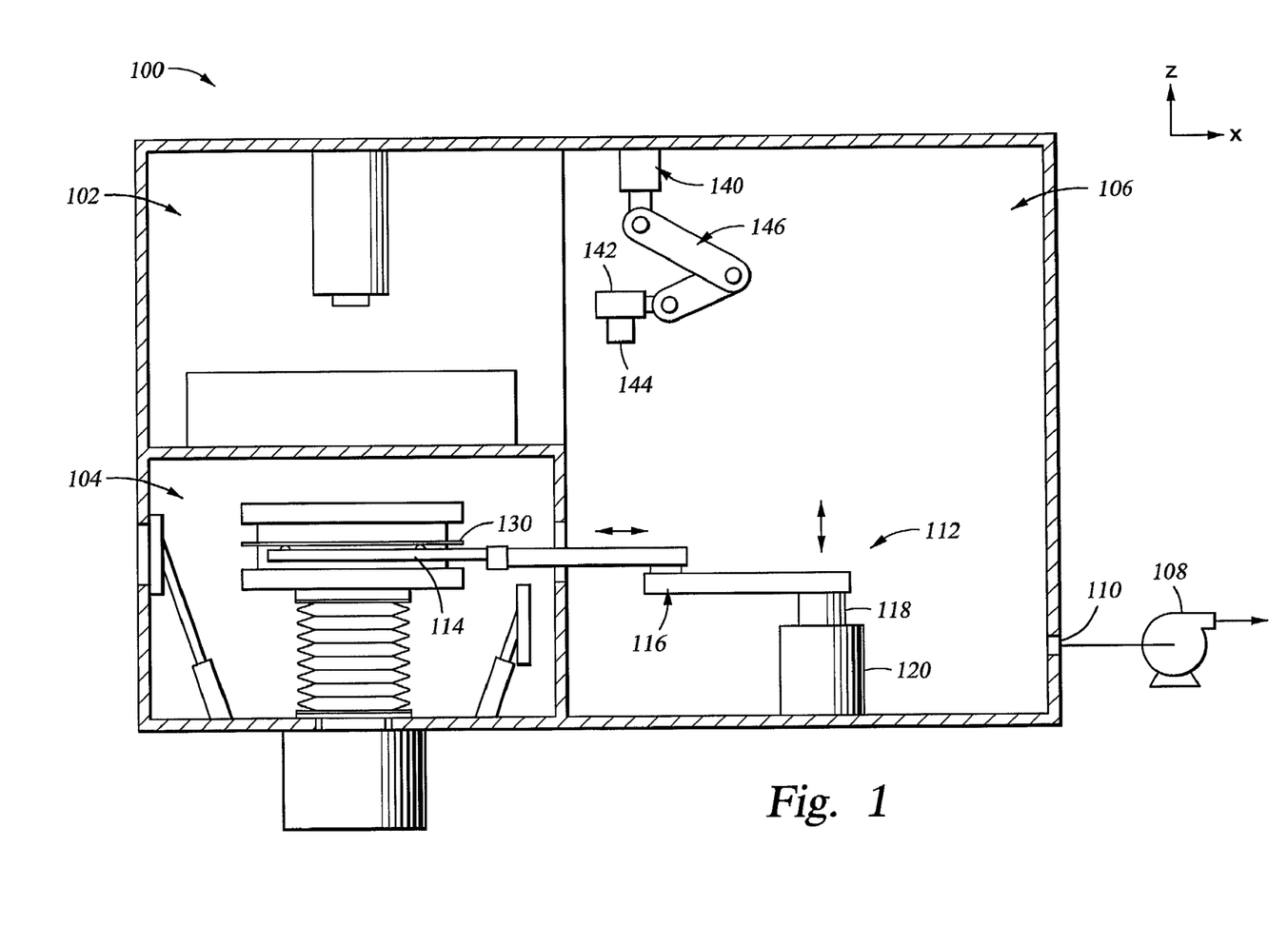
FIG. 1 is a sectional view of one embodiment of a test system.

FIG. 1 depicts one embodiment of a test system 100 for testing and/or inspecting large area glass substrates. The test system 100 generally includes a test station 102, a load lock chamber 104 and a transfer chamber 106 for transferring substrates between the load lock chamber 104 and the test station 102. At least a portion of the test station 102 is mounted above the load lock chamber 104. The transfer chamber 106 is disposed adjacent the load lock chamber 104 and the test station 102. In the embodiment depicted in FIG. 1, the transfer chamber 106 and the test station 102 share a common environment which is typically maintained at a vacuum condition by a pump 108 coupled to a port 110 formed through the transfer chamber 106.

The transfer chamber 106 includes a robot 112 adapted to perform substrate movements within the system 100. In one embodiment, the robot 112 has a range of motion in at least an X/Y coordinate system that enables substrate transfer between the load lock chamber 104 and test station 102 through the transfer chamber 106. The robot 112 generally includes an end effector 114 coupled to a linkage 116. The linkage 116 is coupled to a shaft 118 that extends from a body 120 of the robot 112. The linkage 116 may be actuated in a manner that extends and retracts the end effector 114 relative to the robot body 120 along the X axis to facilitate substrate movement between the transfer chamber 106 and the load lock chamber 104 or the test station 102. The shaft 118 supporting the linkage 116 may be extended or retracted relative to the robot body 120 to control the elevation of the end effector 114 along the Z axis.

For example, the end effector 114 may be extended from the transfer chamber 106 into the load lock chamber 104 to retrieve a substrate 130 to be tested. The end effector 114, now carrying the substrate 130, is retracted into the transfer chamber 106 to a position substantially centered over the robot body 120. The shaft 118 is then extended from the robot body 120, elevating the end effector 114 carrying the substrate 130 to a predetermined elevation adjacent the test station 102. The end effector 114 is then extended into the test station 102 to place the substrate 103 in a predefined location. It is contemplated that robots having alternative configurations may be used to effectuate substrate transfer between the load lock chamber 104 and the test station 102. Optionally, the shaft 118 of the robot 112 may be configured to rotate about a central axis, thereby facilitating movement of the end effector 114 through an X/Y plane at any elevation of the end effector 114.

Figure 2:
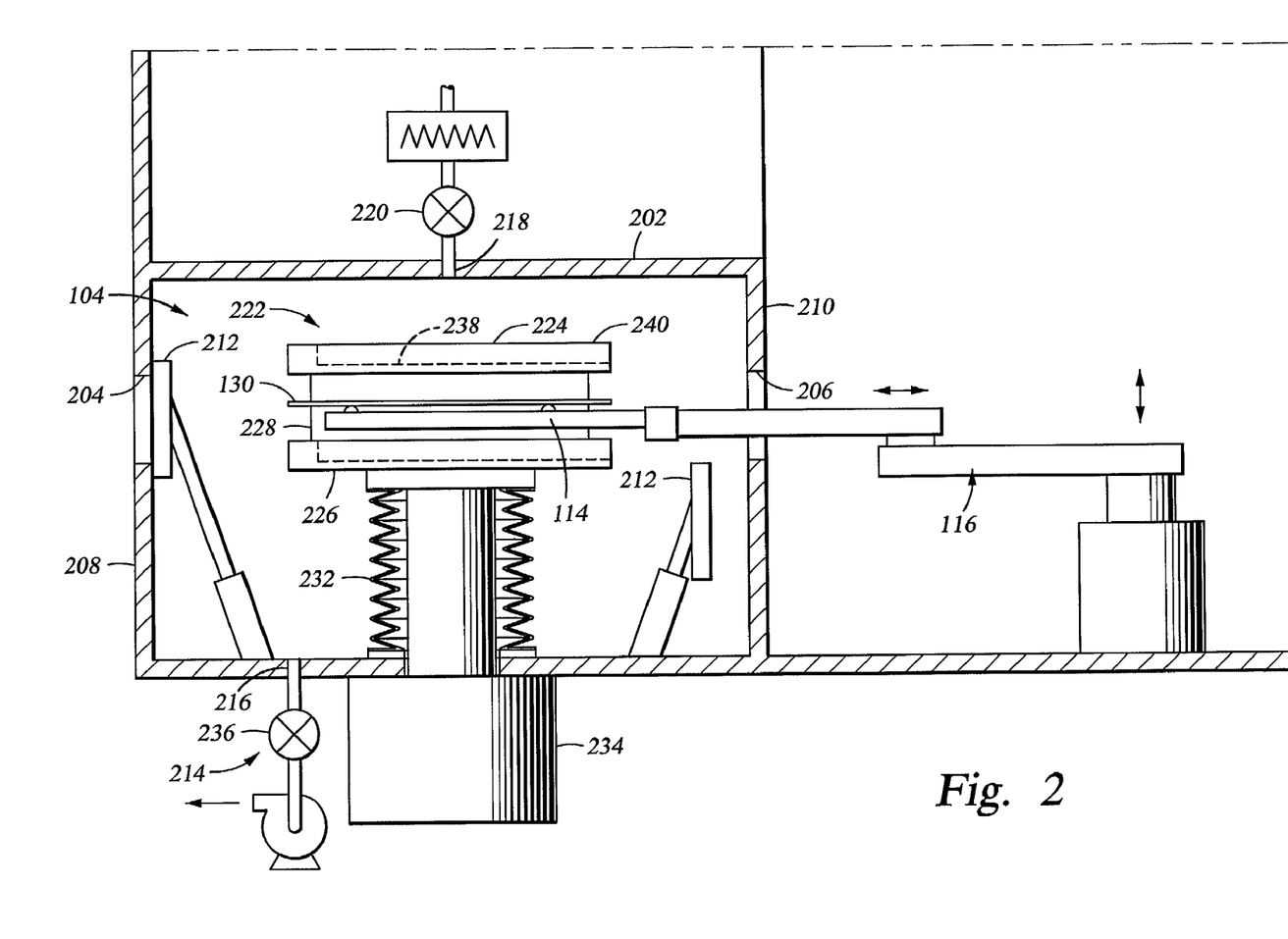
FIG. 2 is a sectional view of one embodiment of a load lock chamber.

FIG. 2 depicts one embodiment of a load lock chamber 104. The load lock chamber 104 generally includes a chamber body 202 having at least a first sealable port 204 and a second sealable port 206 formed through sidewalls 208, 210 of the chamber body 202. Each port 204, 206 is selectively sealable by a slit valve 212 to isolate an interior environment of the chamber body 202. The first port 204 typically couples the load lock chamber 104 to a factory interface (substrate queuing system), a processing system or other device (not shown). The second port 206 is disposed between the load lock chamber 104 and the transfer chamber 106 to facilitate substrate transfer therebetween. A pumping system 214 is coupled to the load lock chamber 104 through a pumping port 216. The pumping system 214 allows the pressure within the load lock chamber 104 to be lowered to a level substantially equal to that of the pressure within the transfer chamber 106. A vent 218, having a flow control valve 220 in communication therewith, is formed through the chamber body 202 of the load lock chamber 104. The control valve 220 may be selectively opened to deliver filtered gas into the load lock chamber 104, raising the pressure within the load lock chamber 104 to a level substantially equal to the pressure in the device coupled to the load lock chamber 104 through the first port 206.

Figure 3:
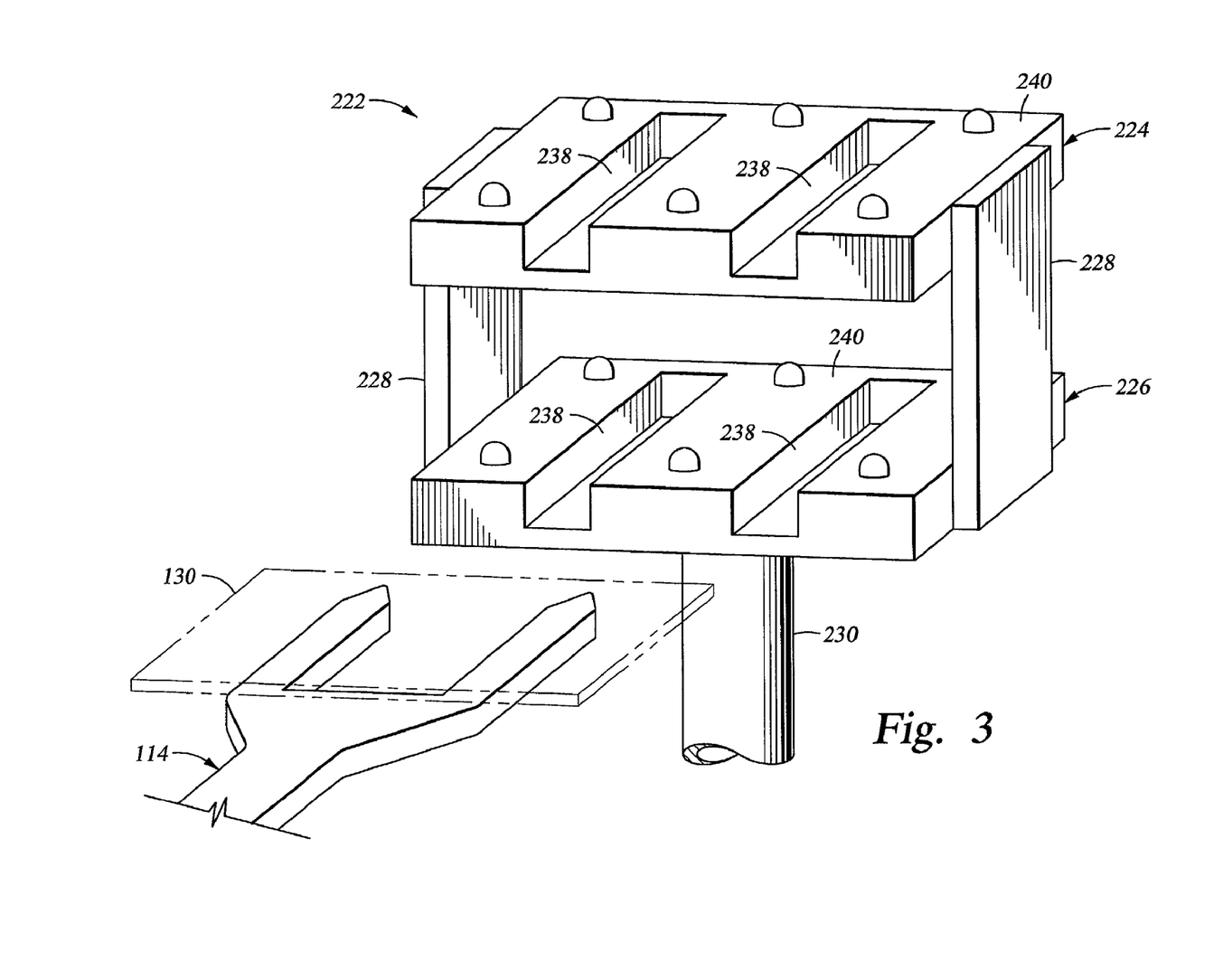
FIG. 3 is a perspective view of one embodiment of a substrate support hoop of the load lock chamber of FIG. 2.

A substrate support hoop 222 is disposed within the chamber body 202. The hoop 222 includes a first substrate support (upper) tray 224 and a second substrate support (lower) tray 226 that are maintained in a stacked, spaced-apart relation by a pair of stanchions 228. Each tray 224, 226 is configured to support a substrate thereon. Typically, one or more grooves 238 (shown in phantom) are formed in an upper surface 240 of each tray 224, 226 to allow the end effector 114 to be passed between the substrate and a respective tray 224, 226 to access the underside of the substrate during substrate transfer. The grooves 238 allow delivery and removal of substrates to and from the trays 224, 226. Alternatively, lift pins may be utilized to space the substrate from the trays 224, 226.

The lower tray 226 is coupled to a lift mechanism 234 by a shaft 230. The lift mechanism 234 allows the trays 224, 226 to change elevation to facilitate substrate transfer with the end effector 114 of the robot 112. For example, the end effector 114 of the robot 112 may be positioned in one groove 238 below a substrate supported on the trays 224, 226. The trays 224, 226 may be lowered to transfer a substrate from one of the trays 224, 226 to the end effector 114. Conversely, the trays 224, 226 may be raised to pick a substrate from the end effector 114 onto one of the trays 224, 226 after a substrate has been positioned thereover. A bellows 232, circumscribing the shaft 230, is typically disposed between the chamber body 202 and second tray 226 to provide a flexible vacuum seal to maintain the vacuum integrity of the load lock chamber 104 during movement of the hoop 222.

In one example of operation, the first port 204 may be opened while the second port 206 is sealed to allow a substrate to be placed within the load lock chamber 104, typically on the lower tray 226. The slit valve 212 sealing the first port 204 is closed and a valve 236 coupled to the pumping system 214 is opened to allow the load lock chamber 104 to be evacuated to a pressure substantially equal to that of the pressure of the transfer chamber 106. The slit valve 212 closing the second port 206 is then opened, allowing the robot 112 to place a tested substrate on the upper tray 224 within the load lock chamber 104. The robot 112 then moves to retrieve the substrate to be tested from the lower tray 226. The robot 112 then moves the substrate to be tested to the test station 102. Once the substrate to be tested is removed from the load lock chamber 104, the slit valve 212 sealingly closes the second port 206, and the valve 220 is opened to allow filtered gas through the vent 218 and into the load lock chamber 104. Once the pressure within the load lock chamber 104 is substantially equal to that of the device coupled to the first port 204, the first port 204 is opened to allow the tested substrate to be retrieved from the load lock chamber 104. Other sequences for passing substrates through a load lock chamber 104 may also be utilized.

Other load locks for transferring one or more substrates may alternatively be utilized. Two examples of load lock chambers that may be adapted to benefit from the invention are described in U.S. patent application Ser. No. 09/464,362 filed Dec. 15, 1999 and U.S. patent application Ser. No. 09/957,784, titled "Double Dual Slot Load Lock for Process Equipment") filed Sep. 21, 2001, both of which are incorporated by reference in their entirety. Alternatively, load locks configured to receive cassettes containing a plurality of substrates may also be utilized.

Figure 4:
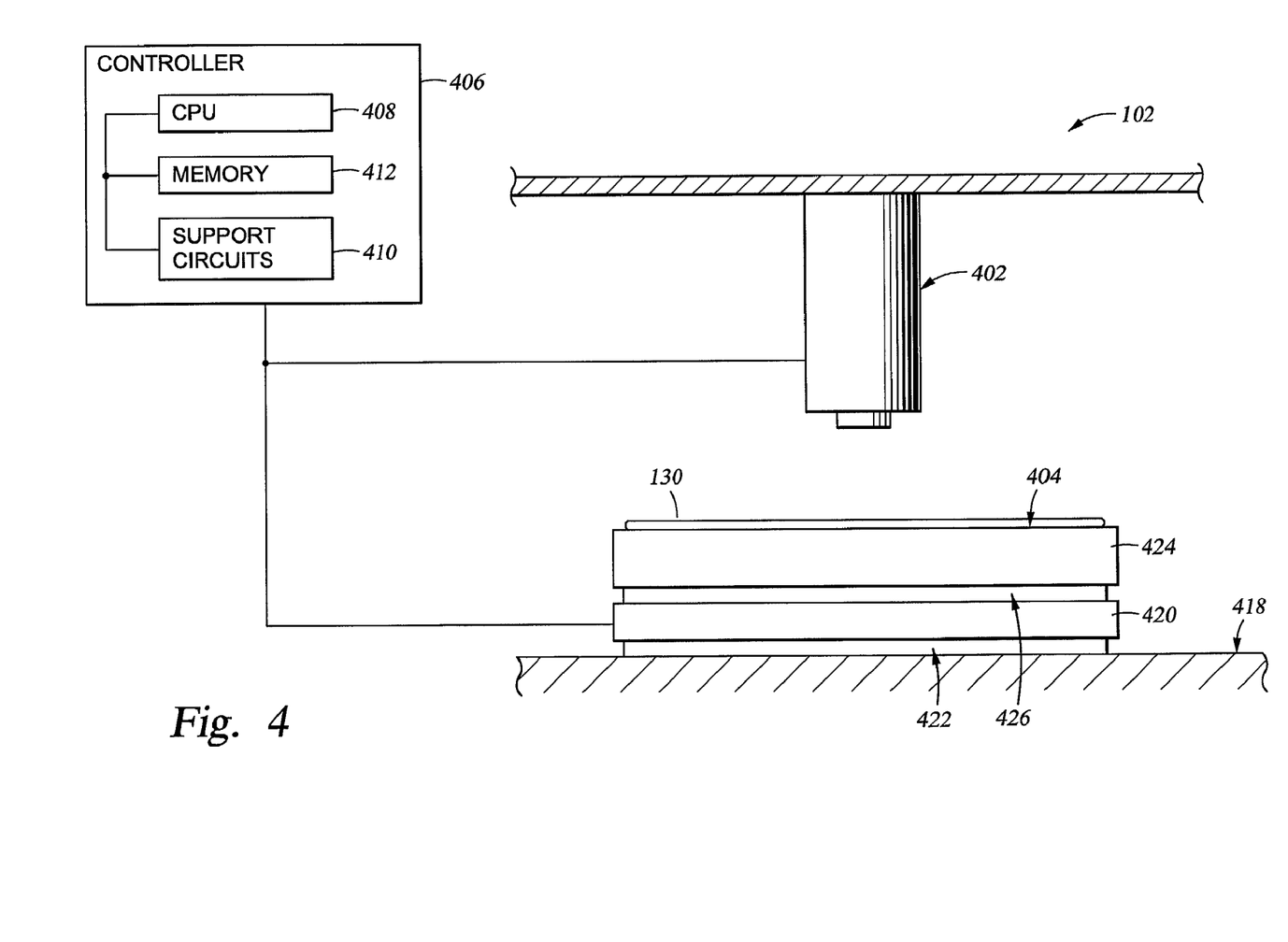
FIG. 4 is a side view of one embodiment of a test station.

FIG. 4 depicts a side view of one embodiment of a test station 102. The test station 102 generally includes one or more test mechanisms 402 mounted over a positioning table 404 adapted to hold a substrate during testing and/or inspection. A controller 406 is coupled to the test mechanism 402 and the positioning table 404 to control a test or inspection process.

The controller 406 typically includes a central processing unit (CPU) 408, support circuits 410 and memory 412. The CPU 408 may be one of any form of computer processor that can be used in an industrial setting for controlling robot movement, substrate positioning and test/inspection routines. The memory 412 is coupled to the CPU 408. The memory 412, or computer-readable medium, may be one or more of readily available memory such as random access memory (RAM), read only memory (ROM), floppy disk, hard disk, or any other form of digital storage, local or remote. The support circuits 410 are coupled to the CPU 408 for supporting the processor in a conventional manner. These circuits include cache, power supplies, clock circuits, input/output circuitry, subsystems, and the like.

The test mechanism 402 provides a portion of at least one of a test or inspection routine. For example, the test mechanism 402 may be a camera for collecting images of discrete portions of the substrate 130, for example, pixels formed on the substrate 130. The test mechanism 402 may alternatively be an electron beam generator that may detect voltage levels of devices formed on the substrate 130 or energize devices formed on the substrate 130 during a test routine. One test station 102 that may be adapted to benefit from the invention is a PUMA™ test system which includes a single electron beam generator mounted over a positioning table. The PUMA™ test system is available from AKT, Inc. division of Applied Materials, Inc., of Santa Clara, Calif.

The positioning table 404 sequentially positions the substrate so that the test mechanism 402 may interact with discrete portions of the substrate. Typically, the positioning table 404 positions those discrete portions of the substrate substantially under the test mechanism 402. The positioning table 404 supports the substrate 130 thereon and may be configured to provide X/Y motion, rotary motion or combinations thereof. In one embodiment, the positioning table 404 includes a stage 420 coupled to a frame 418 of the test station 102 by a first drive system 422, and a carrier 424 that supports the substrate 130 coupled to the stage 420 by a second drive system 426. The first drive system 422 moves the stage 420 linearly along one axis, while the second drive system 426 moves the carrier 424 relative to the stage 420 along a second axis, typically orientated orthogonal to the first axis. The combined motion of the first and second drive systems 422, 426 allows the carrier 424 (and substrate 130 seated thereon) to be moved relative to the test mechanism 402 in the plane defined by the first and second axis.

Figure 5:
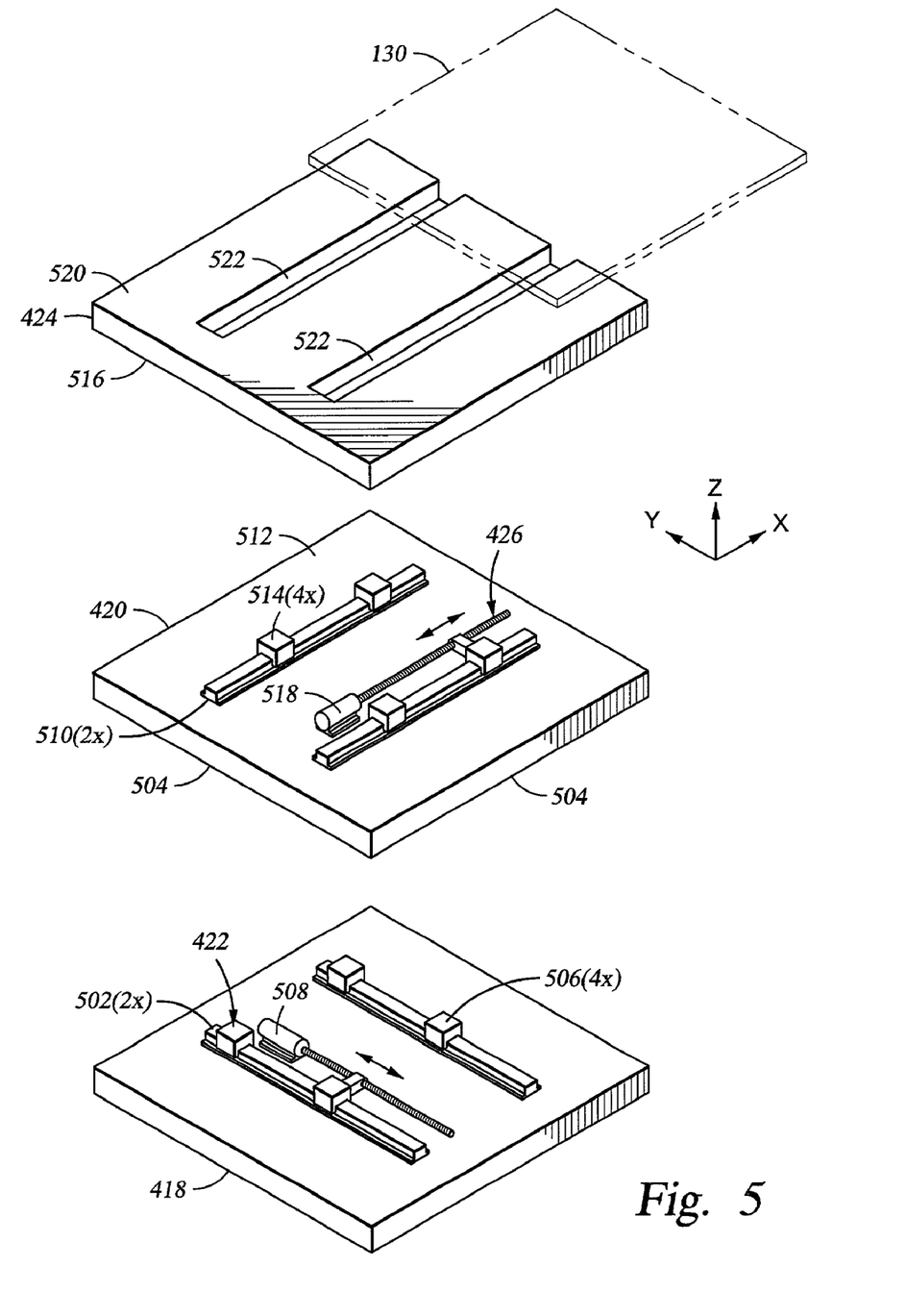
FIG. 5 is an exploded view of one embodiment of a positioning table.

FIG. 5 depicts an exploded view of the positioning table 404 depicted in FIG. 4. The first drive system 422 generally includes a pair of linear rails 502 coupled to the frame 418 of the test station 102. A plurality of guides 506 are movably engaged with the rails 502. The guides 506 are coupled to a first side 504 of the stage 420 (shown attached to the rails 502 in the exploded view of FIG. 5). The guides 506 move along the linear rails 502, thereby allowing the stage 420 to move over the frame 418 in a first direction. A linear actuator 508, such as a ball screw and motor, is coupled between the stage 420 and the frame 418 to control the position of the stage 420 as it moves over the frame 418. In the embodiment depicted in FIG. 5, a first end of the linear actuator 508 is coupled to one of the guides 506 while a second end of the linear actuator 508 is coupled to the frame 418. Other types of linear actuators may be used as well.

The second drive system 426 is configured similar to the first drive system 422. The second drive system 426 includes a pair of linear rails 510 coupled to a second side 512 of the stage 420. The rails 510 are typically oriented in a direction orthogonal to the linear rails 502 coupled to the frame 418. A plurality of guides 514 are coupled to a first side 516 of the carrier 424 (shown attached to the rails 510 in the exploded view of FIG. 5). At least one guide 514 is engaged with each of the linear rails 510 of the second drive system 426 to facilitate movement of the carrier 424 along the linear rails 510 and stage 420. A linear actuator 518, such as a ball screw and motor, is coupled between the stage 420 and the carrier 424 to control the position of the carrier 424 relative to the stage 420. The first and second drive systems 422, 426 are coupled to the controller 406 so that discrete portions of the substrate (for example, pixels) may be positioned to interface with the test mechanism 402. Generally, the drive systems 422, 426 have a range of motion that allows all of the pixels to be moved to a position where they may interface with the test mechanism 402 during testing.

A second side 520 of the carrier 424 is adapted to support the substrate 130 during testing and/or inspection. At least one groove 522 (two are shown in FIG. 5) is formed in the second side 520 of the carrier 424 to allow the end effector 114 to access the substrate 130 while positioned on the second side 520 to facilitate substrate transfer.

Figure 6:
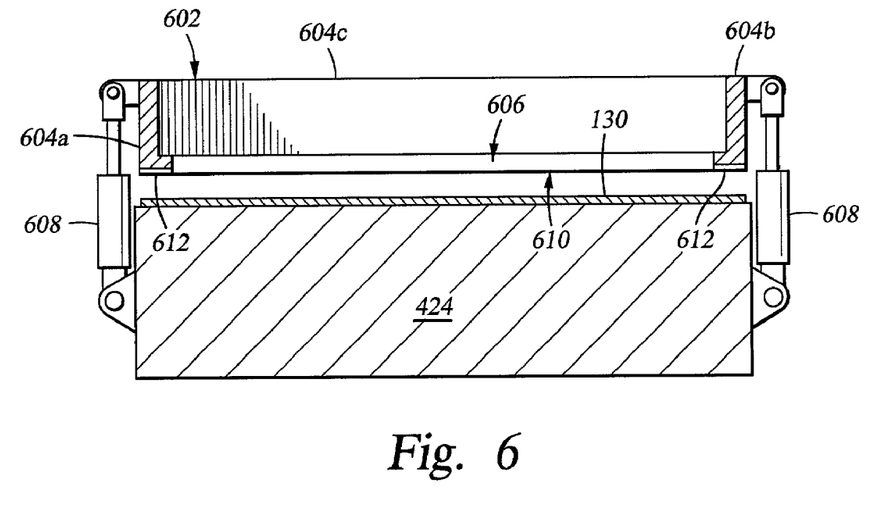
FIG. 6 is a sectional view of one embodiment of a carrier of the positioning table of FIG. 5.

FIG. 6 depicts a sectional view of one embodiment of a carrier 424. The carrier 424 includes a prober 602 that clamps the substrate 130 to the second side 520 of the carrier 424 during testing. The prober 602 generally has a picture frame configuration, having sides (sides 604a–b shown in cross section and side 604c shown in the background) at least partially defining at least one opening or window 606 through which the testing mechanism 402 interacts with the substrate 130. Each window 606 is positioned to allow a predefined field of pixels (or other device) formed on the substrate 130 to be tested by the system 100 to be exposed to the field of view or the electron beam generated by the test mechanism 404. Accordingly, the number, size and positions of the windows 606 in a particular prober 602 are chosen based upon the layout of the substrate to be tested.

The prober 602 is coupled to the carrier 424 by one or more actuators 608. In the embodiment depicted in FIG. 6, the actuators 608 are pneumatic cylinders, however, other types of actuators suitable for clamping the substrate are contemplated. The actuators 608 may be extended to place the prober 602 in a spaced-apart relation relative to the second side 520 of the carrier 424 to facilitate removal or placement of the substrate 130 on the carrier 424 by the robot 112. The actuators 602 may be actuated to urge the prober 602 against the substrate 130, thereby securing the substrate to the carrier 424.

A face 610 of the prober 602 contacting the substrate 130 generally includes a plurality of electrical contact pads 612 that are coupled to the controller 406. The electrical contact pads 612 are positioned to provide electrical connection between a predetermined pixel (or other device formed on the substrate 130) and the controller 406. Thus, as the prober 602 is urged against the substrate 130 to secure the substrate 130 against the carrier 424, electrical contact between the controller 406 and the devices on the substrate 130 are made through the contact pads 612. This allows the controller to apply a voltage to a selected pixel or to monitor each pixel for changes in attributes, such as voltage, during testing.

In one embodiment, the substrate is tested by sequentially impinging an electron beam emitted from the test mechanism 402 on discrete portions or pixels composing the thin film transistor matrix. After a pixel is tested, the positioning table 404 moves the substrate so that another pixel may be tested. Electron beam testing may employ several test methods. For example, the electron beam may be utilized to sense pixel voltages in response to the voltage applied across the pixels or the pixel through the electrical connections in the prober 602. Alternatively, a pixel or a plurality of pixels may be driven by the electron beam which provides a current to charge up the pixel(s). The pixel response to the current may be monitored by the controller 406 that is coupled across the pixel by the prober 406 to provide defect information. Examples of electron beam testing are described in U.S. Pat. No. 5,369,359, issued Nov. 29, 1994 to Schmitt; U.S. Pat. No. 5,414,374, issued May 9, 1995 to Brunner et al.; U.S. Pat. No. 5,258,706, issued Nov. 2, 1993 to Brunner et al.; U.S. Pat. No. 4,985,681, issued Jan. 15, 1991 to Brunner et al.; and U.S. Pat. No. 5,371,459, issued Dec. 6, 1994 to Brunner et al., all of which are hereby incorporated by reference in there entireties. The electron beam may also be electromagnetically deflected to allow a greater number of pixels to be tested at a given positioning table 404 position.

Referring to FIGS. 1 and 4, the test system 100 may include a vision system 140 for inspecting defects identified during testing to facilitate identification and repair of defects on the substrate. In one embodiment, the vision system 140 includes a camera 142 coupled to the controller 406. The camera 142 has a lens 144 of sufficient resolution to allow identification and/or inspection of one or more pixels. In one embodiment, the lens 144 has a magnification that allows approximately 3–5 pixels to be viewed simultaneously. Other lens may alternatively be utilized. An image captured by the camera 142 is transmitted to the controller. The transmission between the camera 142 and controller may be hardwired, wireless, infrared or other type of signal. The controller may display the signal for inspection by an operator. The operator may enter a code associating the type of defect and its position on the substrate for use during the digital processing and/or repair. Alternatively, the image may be processed by the controller to compare the image to a pre-defined image stored in memory of each type of potential defect. The controller compares the image of the pixels with the images stored in memory to determine the type of damage or defect existing at that location on the substrate.

The camera 142 may be coupled to the test mechanism 402 or fixed in another position of the test station 102 or transfer chamber 106. In the embodiment depicted in FIG. 1, the camera 142 is supported by a robot 146 mounted to the transfer chamber. The robot 146 has a range of motion to place the camera 142 in a position that enables viewing of a selected pixel. Depending on the position of the defect and the selection of the camera position, the prober (602 depicted in FIG. 6) may require actuation away from the positioning table 404 in order to facilitate viewing of pixels proximate the prober by the camera 142.

Figure 7:
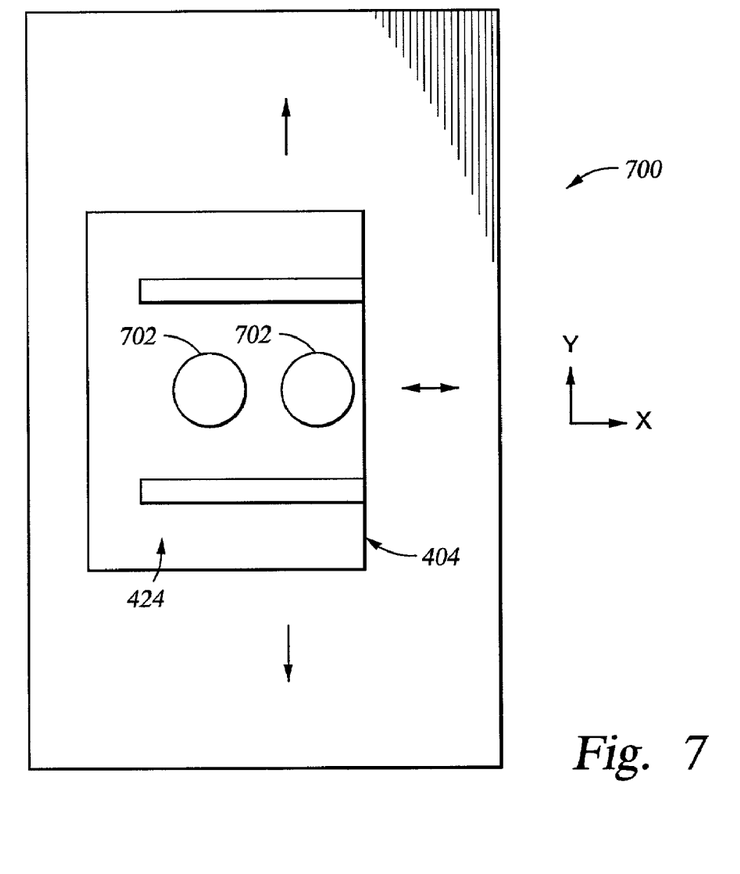
FIG. 7 is a plan view of another embodiment of a test station.

FIG. 7 depicts a top view of another embodiment of a test station 700. The test station 700 is configured similar to the test station 102 described above except wherein the test station 700 includes a plurality of electron beam generators 702 (two are shown in FIG. 7). The electron beam generators 702 are positioned in a spaced-apart relation, typically slightly less than half of the width of the carrier 424. The positioning and use of two electron beam generators 702 allows the range of motion of the positioning table 404 to be approximately half of the range of motion required with the single electron beam source utilized in the test station 102 described above. As the range of motion required by the positioning table 404 is significantly reduced, the footprint of the test station 700 (and entire system) is advantageously reduced. The use of a third or additional electron beam generators to further reduce the footprint is also contemplated.

Figure 8:
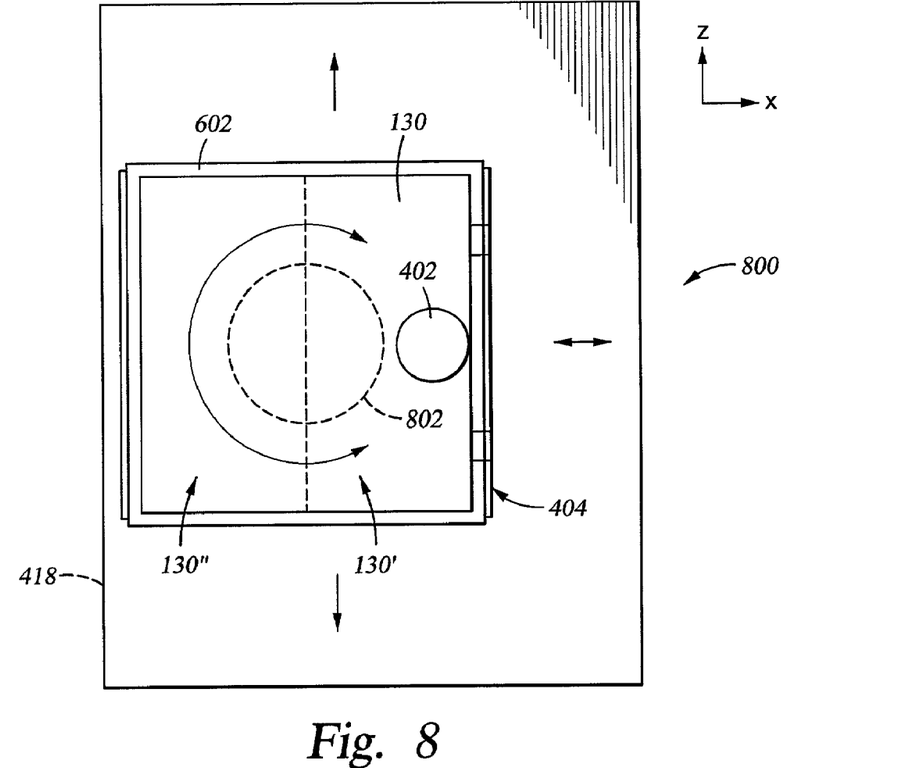
FIG. 8 is a plan view of another embodiment of a test station.

FIG. 8 depicts another embodiment of a test station 800. The test station 800 is generally similar to the test stations described above except that the test station 800 is adapted to rotate the substrate 130. In one embodiment, the test station 800 includes a positioning table 404, a test mechanism 402 and a prober 602. The test station 800 additionally includes a turntable or other rotational device 802 (shown in phantom) disposed between the positioning table 404 and a frame 418 of the test station 800. The rotational device 802 may be actuated to rotate the positioning table 404 and substrate 130 seated thereon through a pre-determined angle. For example, the rotational device 802 may rotate the positioning table 404 through 180 degrees after about half of the substrate 130 has been tested (shown as 130'). The rotation of the substrate 130 places the untested portion 130" of the substrate 130 in the position of the portion 130' of the substrate previously tested. Thus, the positioning table 404 need only move the substrate through the same range of motion to complete testing of the substrate, thereby substantially reducing the range of motion required of one of the drive systems 422, 426 needed to pass the substrate under the test mechanism 402. In embodiments where more than one inspection device is utilized, as seen in FIG. 3, the rotational device 802 may be utilized to further reduce the travel needed to insure adequate coverage of the substrate during testing. It is contemplated that the rotary mechanism may be alternatively coupled between the positioning table 404 and the substrate 130, or within the positioning table 404 itself.

Figure 9:
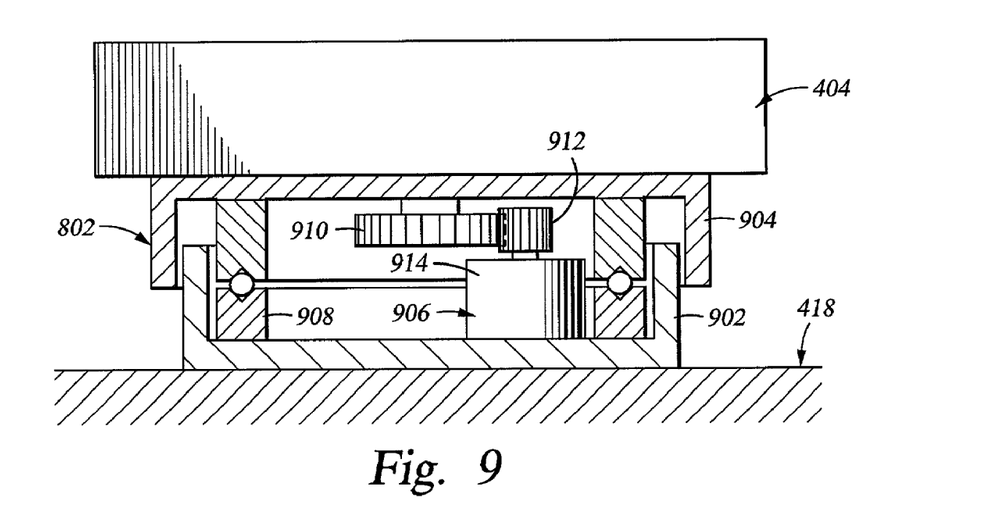
FIG. 9 is a sectional view of one embodiment of a turntable.

FIG. 9 depicts a partial cut-away perspective view of one embodiment of a rotational device 802. The rotational device 802 generally includes a base plate 902 rotationally mounted to a top plate 904. The top plate 904 is coupled to the positioning table and the base plate 902 is coupled to the frame 418. The angular rotation of the top plate 904 relative the base plate 902 is controlled by an actuator 906. Bearings 908 are typically utilized between the top plate 904 and the base plate 902 to insure smooth rotation and accurate and repeatable positioning of the top plate 904. The actuator 906 driving the top plate 904 relative to the base plate 902 may be a motor and timing belt, linear actuator, stepper motor, pneumatic cylinder, hydraulic cylinder or other device suitable for repeatably controlling the angular displacement between the top plate 904 and base plate 902. In one embodiment, a first gear 910 is coupled to the top plate 904 and is engaged by the actuator 906, for example, a second gear 912 driven by a motor 914.

Figure 10:
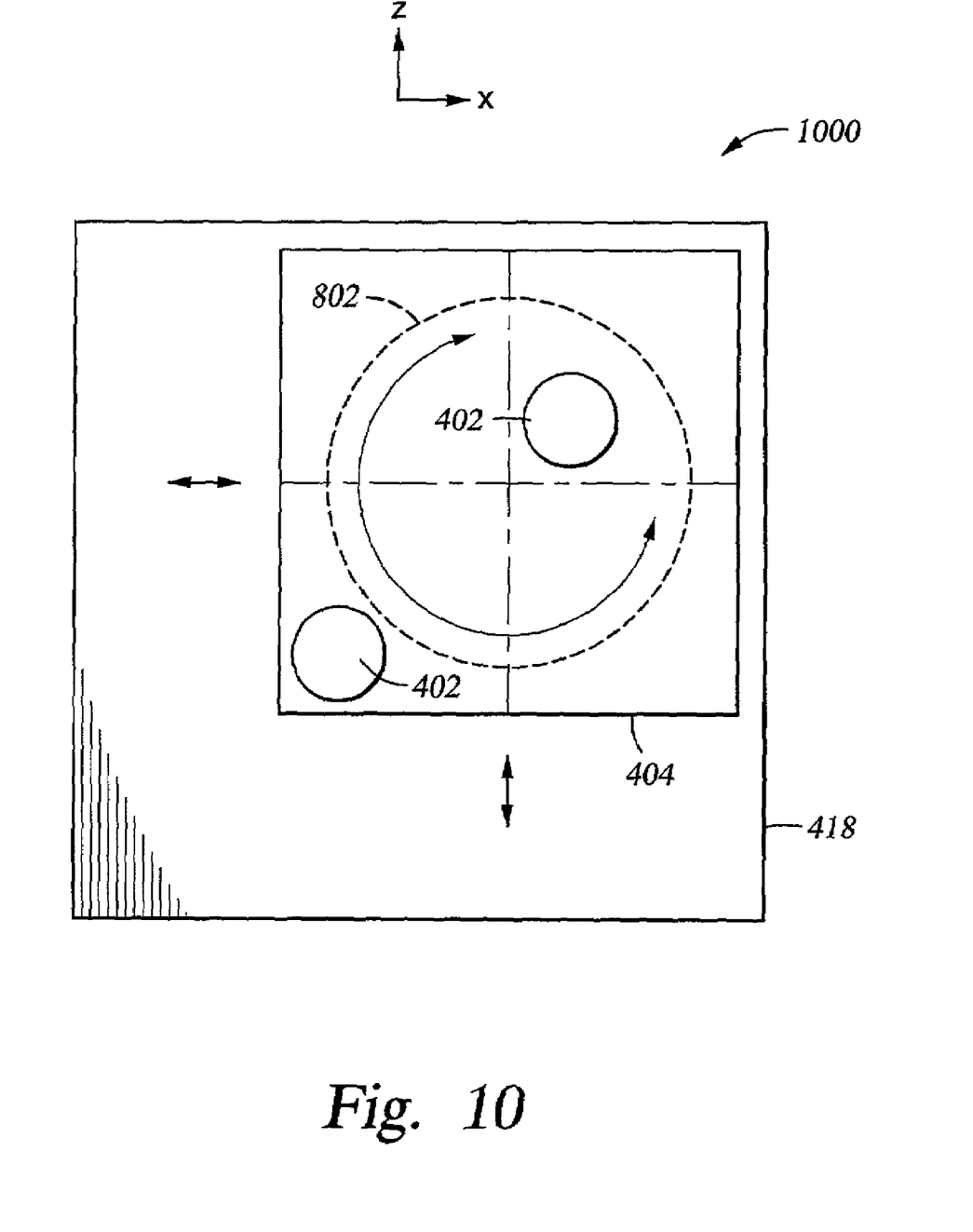
FIG. 10 is plan view of another embodiment of a test station.

FIG. 10 depicts another embodiment of a test station 1000 having two or more testing devices 402 positioned to cover opposing quadrants of a substrate 130 during testing. A rotational device 802 (shown in phantom) is coupled between a base 418 of the system 1000 and a positioning table 404. The rotational device 802 may rotate the positioning table 404 about 90 degrees to substantially reduce the required travel in each axis of motion through which the positioning table 404 moves, thereby reducing footprint requirements of the test station 1000 (and system coupled thereto) in two directions.

Figure 11:
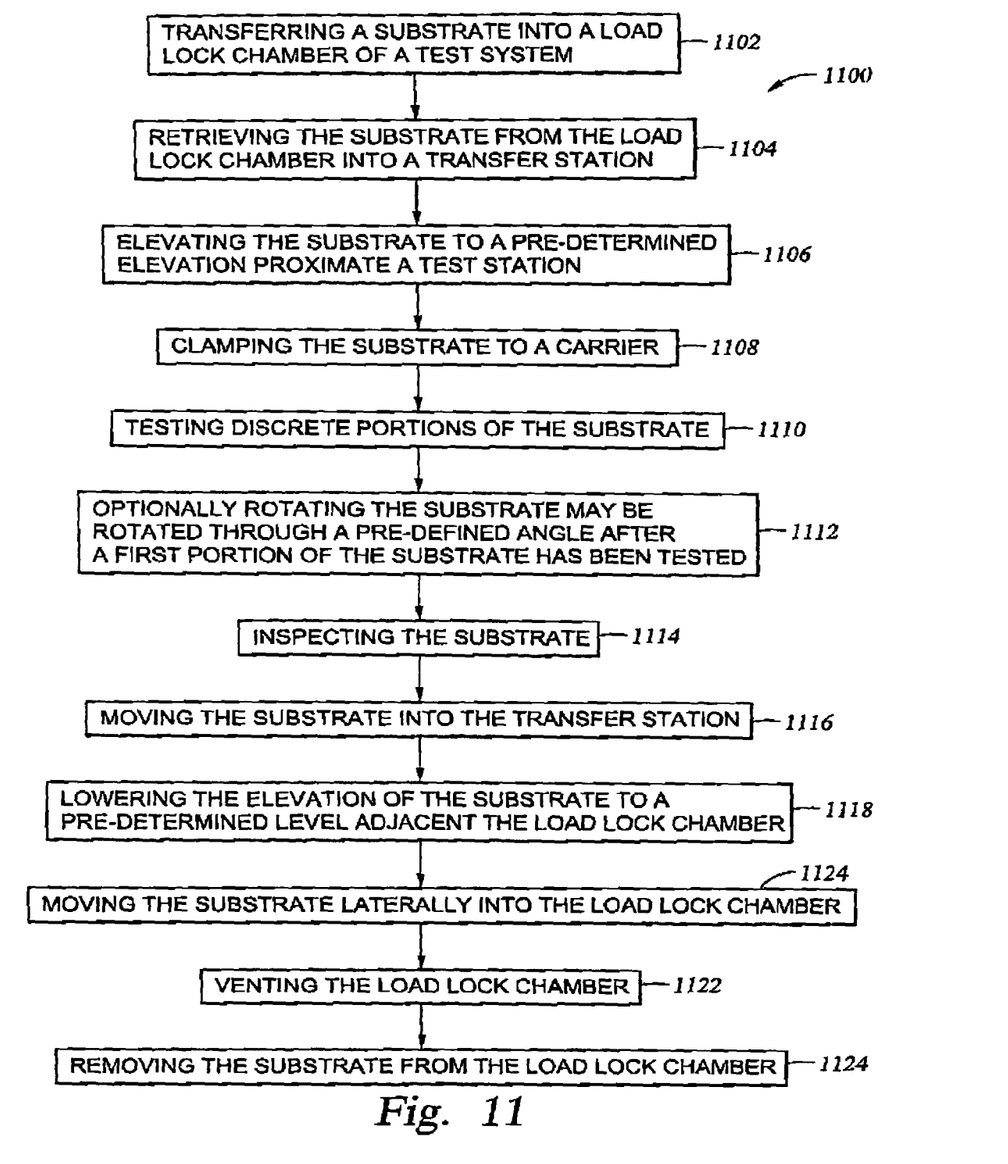
FIG. 11 is a flow diagram of one embodiment of a test routine of the invention.

FIG. 11 depicts a block diagram of a routine 1100 representative of one mode of operation. At step 1102, a substrate is transferred into the load lock chamber 104 of the system 100. Step 1102 additionally includes substantially equalizing the pressure between the load lock chamber 104 and the transfer chamber 106. At step 1104, the robot 112 retrieves the substrate 130 from the load lock chamber 104 and moves the substrate into the transfer chamber 106. At step 1106, the robot 112 elevates the substrate to a predetermined elevation that enables the substrate to be transferred to the carrier 424 disposed in the test station 102. At step 1108, the prober 602 clamps the substrate to the carrier 424 and provides an electrical path between the controller 406 and devices (i.e., pixels) formed on the substrate. At step 1110, testing is commenced by passing discrete portions of the substrate (i.e., the pixels) under one or more test mechanisms 402 by utilizing the positioning table 404. As described above, testing may include passively probing the substrate with the electron beam, energizing the pixel using the electron beam, visually inspecting the pixel using a vision system or other type of test. Optionally, at step 1112, the substrate may be rotated through a pre-defined angle after a first portion of the substrate has been tested to allow testing of the remainder of the substrate. At step 1114, pre-determined pixels tested utilizing an electron beam may be further inspected utilizing a vision system 140.

The substrate is then removed from the test station 102 at step 1116 by unclamping the probers and retrieving the substrate by the robot into the transfer chamber 106. At step 1120, the robot lowers the elevation of the substrate to a level to facilitate transfer of the substrate to a pre-determined level adjacent the load lock chamber 104. At step 1122, the substrate is moved laterally into the load lock chamber 104. At step 1126, the load lock chamber 104 is vented to allow pressure equalization between the load lock chamber 104 and the atmosphere or device outside the system. At step 1128, the tested substrate is removed from the load lock chamber 104 and a new substrate to be tested is placed therein.

Figure 12:
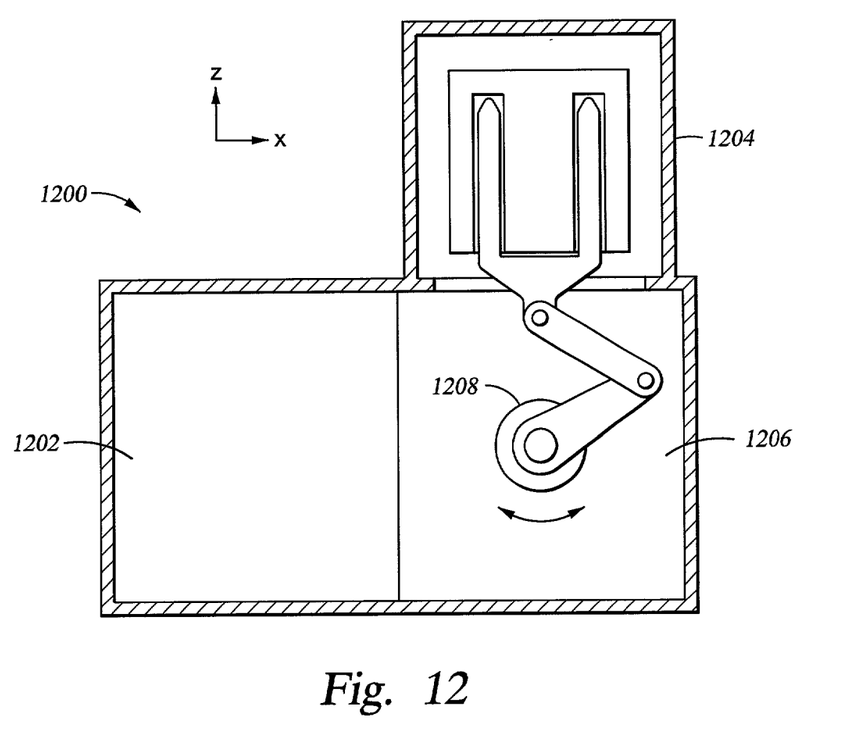
FIG. 12 is a plan view of another embodiment of a test station.

FIG. 12 depicts another embodiment of a test system 1200. The test system 1200 includes a test station 1202 similar to those described above, and additionally includes at least one repair station 1204 coupled to a transfer chamber 1206. A robot 1208, disposed within the transfer chamber 1206, is rotatable about it's axis enabling substrate transfer to the repair station 1204.

Figure 13:
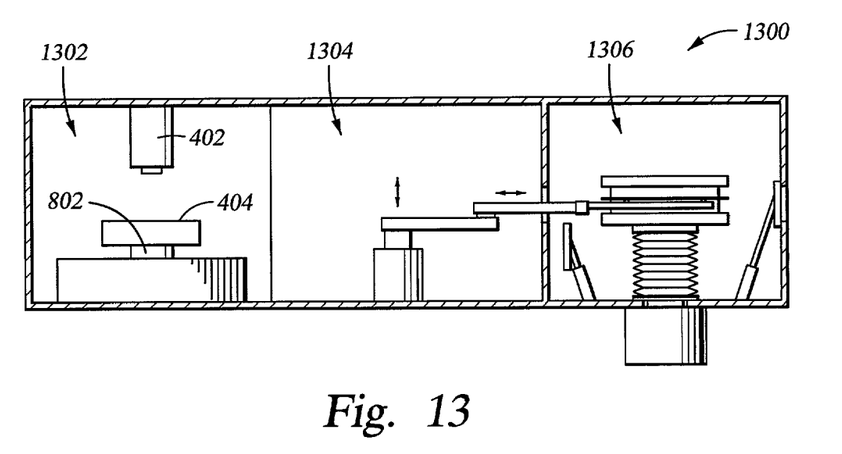
FIG. 13 is a side view of another embodiment of a test station.

FIG. 13 depicts another embodiment of a test system 1300. The system 1300 includes a test station 1302 and a load lock chamber 1306 coupled by a transfer chamber 1304. The test station 1302, the transfer chamber 1304 and the load lock chamber 1306 are similar to those described above, except that the load lock chamber 1306 and test station 1302 do not vertically over-lap. The test station 1302 is compact as compared to conventional designs and includes at least one space-saving feature, such a plurality of test mechanisms 402 or a rotational device 802.

Figure 14:
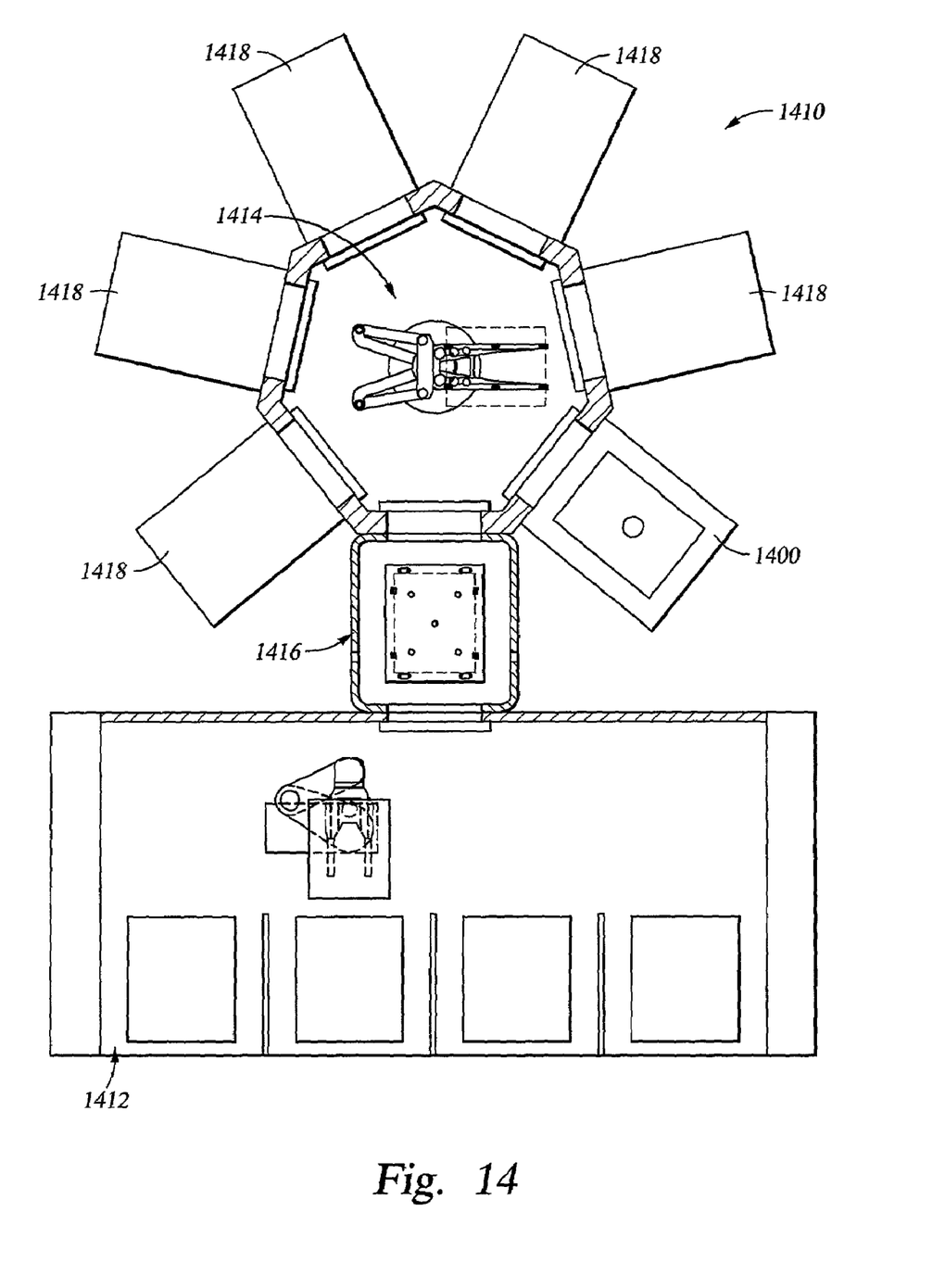
FIG. 14 is a plan view of one embodiment of a cluster tool having a test station.

FIG. 14 depicts one embodiment of a cluster tool 1410 having a test station 1400 integral thereto. The cluster tool 1410 includes a factory interface 1412 and a central transfer chamber 1414 coupled by at least one load lock chamber 1416. A plurality of process chamber 1418 are coupled to the transfer chamber 1414 to facilitate substrate processing. The test station 1400 is coupled to the transfer chamber 1414 to facilitate in process testing of substrates processed within the tool 1410. The test station 1400 may be similar to any of the test stations described above. A cluster tool that may be adapted to benefit from the invention is a 10K Gen 5 CVD system, available from AKT, Inc., a division of Applied Materials, Inc.

Thus, a test system is provided that substantially reduces the footprint required, compared to conventional testing systems capable of testing substrates. The system may be configured with multiple test mechanisms to additionally reduce footprint requirements and increase testing throughput. As the various embodiments disclosed may be configured to include one or more size-reducing features, the selection of the number of testing mechanisms and the use of a turntable having the resulting benefits of increased throughput and reduced footprint size may be weighed against footprint costs in order to select a configuration best suited for a particular application.

While the foregoing is directed to the preferred embodiment of the present invention, other and further embodiments of the invention may be devised without departing from the basic scope thereof. The scope of the invention is determined by the claims that follow.

What is claimed is:

1. A system for testing a substrate comprising:
   a load lock chamber having a passage selectively sealed by a slit valve;
   a transfer chamber coupled to the load lock chamber by the passage;
   a test station stacked at least partially above the load lock chamber and coupled to the transfer chamber; and
   a robot disposed in the transfer chamber adapted to transfer substrates between the load look chamber and the test station, wherein the test station further comprises:
      a positioning table adapted to move the substrate within a pre-defined planar range of motion; and
      a test mechanism adapted to selectively interact with discrete areas of the substrate positioned substantially thereunder by the positioning table.

2. The test mechanism of claim 1, wherein the test mechanism is a camera.

3. The test mechanism of claim 2, wherein the camera is mounted to a robotic mechanism adapted to position the camera over the substrate.

4. The test system of claim 1, wherein the positioning table is an X/Y table.

5. The test system of claim 4 further comprising:
   a turntable coupled to the X/Y table, the turntable adapted to rotate the substrate through a pre-defined angle.

6. The test system of claim 1, wherein the test station further comprises a frame having one or more windows adapted to urge the substrate against the positioning mechanism.

7. The test system of claim 6, wherein the frame further comprises:

a plurality of electrical connections adapted to provide a controller with a test characteristic of a device formed in the substrate.

8. The test system of claim 7, wherein the test mechanism is one or more electron beam generators.

9. The test system of claim 8, wherein the test mechanisms are two electron beam generators disposed in a spaced-apart relation.

10. The test system of claim 7, wherein the test characteristic is a voltage change measured between two or more of the electrical connections across the device formed in the substrate.

11. The test system of claim 1 further comprising:
a vision system adapted to view pre-determined areas of the substrate disposed in the test station.

12. The test system of claim 1 further comprising:
a pumping system coupled to the load lock chamber and configured to control pressure within the load lock chamber relative to the test station.

13. The system of claim 1 further comprising:
a pumping system coupled to the load lock chamber and configured to control pressure within the load lock chamber relative to the test station.

14. The test system of claim 1, wherein the load lock chamber is adapted to retain two or more substrates therein.

15. The test system of claim 1, wherein the test station is stacked on top of the load lock chamber.

16. A method for testing a substrate comprising:
evacuating a load lock chamber containing a substrate;
transferring the substrate from the evacuated load lock chamber to a transfer chamber;
elevating the substrate within the transfer chamber;
transferring the elevated substrate from the transfer chamber to a test station stacked at least partially above the load lock chamber; and
testing the elevated substrate, wherein the step of testing further comprises:
capturing an image of discrete portions of the substrate.

17. The method of claim 16, wherein the step of testing further comprises:
displaying the captured image.

18. The method of claim 17, wherein the step of testing further comprises:
comparing the captured image to Images stored in memory of a controller.

19. The method of claim 16, wherein the steps of transferring the substrate from the load lock chamber to the transfer chamber and transferring the substrate from the transfer chamber to the substrate test station move the substrate in opposite directions.

20. A method for testing a substrate comprising:
evacuating a load lock chamber containing a substrate;
transferring the substrate from the evacuated load lock chamber to a transfer chamber;
elevating the substrate within the transfer chamber;
transferring the elevated substrate from the transfer chamber to a test station stacked at least partially above the load lock chamber; and
testing the elevated substrate, wherein the step of testing further comprises:
interacting with discrete portions of the substrate with an electron beam.

21. The method of claim 20, wherein the step of testing further comprises:
detecting a change in voltage across a discrete portion of the substrate.

22. The method of claim 20, wherein the step of testing further comprises:
energizing a pixel formed on the substrate with the electron beam.

23. The method of claim 20, wherein the steps of transferring the substrate from the load lock chamber to the transfer chamber and transferring the substrate from the transfer chamber to the substrate test station move the substrate in opposite directions.

24. A method for testing a substrate comprising:
evacuating a load lock chamber containing a substrate;
transferring the substrate from the evacuated load lock chamber to a transfer chamber;
elevating the substrate within the transfer chamber;
transferring the elevated substrate from the transfer chamber to a test station stacked at least partially above the load lock chamber; and testing the elevated substrate, wherein the step of testing comprises:
determining a defect on the substrate; and
capturing an image of the defect.

25. The method of claim 24, further comprising:
moving the substrate to a repair station coupled to the transfer chamber.

26. The method of claim 24, wherein the steps of transferring the substrate from the load lock chamber to the transfer chamber and transferring the substrate from the transfer chamber to the substrate test station move the substrate in opposite directions.

27. A method for testing a substrate comprising:
evacuating a load lock chamber containing a substrate;
transferring the substrate from the evacuated load lock chamber to a transfer chamber;
elevating the substrate within the transfer chamber;
transferring the elevated substrate from the transfer chamber to a test station stacked at least partially above the load lock chamber; and testing the elevated substrate, wherein the stop of testing further comprises:
moving the substrate through an X/Y planar motion.

28. The method of claim 27 further comprising:
rotating the substrate through a pre-determined angle.

29. The method of claim 27, wherein the steps of transferring the substrate from the load lock chamber to the transfer chamber and transferring the substrate from the transfer chamber to the substrate test station move the substrate in opposite directions.

30. A method for testing a substrate comprising:
evacuating a load lock chamber containing a substrate;
transferring the substrate from the evacuated load lock chamber to a transfer chamber;
elevating the substrate within the transfer chamber;
transferring the elevated substrate from the transfer chamber to a test station stacked at least partially above the load lock chamber; and testing the elevated substrate, wherein the step of testing further comprises:
testing a first portion of the substrate;
rotating the substrate; and
testing a second portion of the substrate.

31. The method of claim 30, wherein the steps of transferring the substrate from the load lock chamber to the transfer chamber and transferring the substrate from the transfer chamber to the substrate test station move the substrate in opposite directions.

* * * * *

UNITED STATES PATENT AND TRADEMARK OFFICE
CERTIFICATE OF CORRECTION

| | | |
|---|---|---|
| PATENT NO. | : 7,129,694 B2 | Page 1 of 1 |
| APPLICATION NO. | : 10/155796 | |
| DATED | : October 31, 2006 | |
| INVENTOR(S) | : Brunner et al. | |

It is certified that error appears in the above-identified patent and that said Letters Patent is hereby corrected as shown below:

Column 10, Line 43: Change "look" with --lock--

Signed and Sealed this

First Day of May, 2007

JON W. DUDAS
*Director of the United States Patent and Trademark Office*